US006455343B1

(12) United States Patent
Chen et al.

(10) Patent No.: US 6,455,343 B1
(45) Date of Patent: Sep. 24, 2002

(54) METHOD OF MANUFACTURING LIGHT EMITTING DIODE WITH CURRENT BLOCKING STRUCTURE

(75) Inventors: Tzer-Perng Chen; Chih-Sung Chang; Holin Chang, all of Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 09/537,581

(22) Filed: Mar. 28, 2000

(51) Int. Cl.[7] .............................................. H01L 21/00
(52) U.S. Cl. .............................. 438/40; 257/97; 372/45
(58) Field of Search ........................ 438/40–44, 400, 438/424, 778; 257/21, 94–103, 615; 372/44, 46

(56) References Cited

U.S. PATENT DOCUMENTS

| 5,565,694 A | * | 10/1996 | Huang et al. | .................. 257/97 |
| 5,568,499 A | * | 10/1996 | Lear | .............. 372/45 |
| 6,121,635 A | * | 9/2000 | Watanabe et al. | ............. 257/91 |
| 6,185,238 B1 | * | 2/2001 | Onomura et al. | ............. 372/46 |

* cited by examiner

*Primary Examiner*—Caridad Everhart
*Assistant Examiner*—Calvin Lee
(74) *Attorney, Agent, or Firm*—Harness, Dickey & Pierce, P.L.C.

(57) ABSTRACT

The present invention provides a method of manufacturing a light emitting diode based on an epitaxial layer structure. The epitaxial layer structure includes a substrate of a first conductivity type, a lower cladding layer of the first conductivity type formed on a top side of the substrate, an active layer formed on the lower cladding layer, an upper cladding layer of a second conductivity type formed on the active layer, at least one upper aluminum-rich layer formed on the upper cladding layer, and a cap layer formed on the at least one upper aluminum-rich layer. The method includes the steps of forming an opening hole in the epitaxial layer structure for passing through each upper aluminum-rich layer, oxidizing a predetermined region of each upper aluminum-rich layer, filling the opening hole with an insulating material, and forming an upper electrode on the cap layer and a lower electrode on a back side of the substrate.

30 Claims, 18 Drawing Sheets

METHOD OF MANUFACTURING LIGHT EMITTING DIODE WITH CURRENT BLOCKING STRUCTURE

BACKGROUND OF THE INVENTION

1. Field of the Invention

The present invention relates to a method of manufacturing a light emitting diode, and more particularly, to a method of manufacturing a light emitting diode with a current blocking structure.

2. Description of the Prior Art

Please refer to FIG. 1. FIG. 1 is a schematic diagram of a light emitting diode 10 according to the prior art. The dashed lines shown in FIG. 1 indicate the current flow. The AlGaInP quaternary compound semiconductor material is a promising material for making a light emitting diode with emission wavelength ranging from 650 nm to 560 nm. However, the AlGaInP material with high aluminum content is very difficult to dope heavily in P-type. Normally, a light emitting diode 10 using N-type GaAs 12 as substrate has a P-type AlGaInP upper cladding layer 14 near the upper electrode 16 as shown in FIG. 1. Due to low mobility and low carrier concentration, the P-type AlGaInP upper cladding layer 14 has higher resistivity. Therefore, the injected current would be restricted to flow only through the active layer 18 that is underneath the upper electrode 16. Because the light generated only from the active layer 18 which is underneath the upper electrode 16, most of the light would be absorbed by the opaque upper electrode 16 as shown in FIG. 1. The luminous intensity of the light emitting diode 10 is not very high. In order to solve the current crowding problem, a large bandgap and low resIstivity thick window layer was proposed by U.S. Pat. No. 5,008,718 to enable current to spread out the contact and reduce contact shadowing. Because it is difficult to find out large bandgap and at the same time lower resistivity semiconductor material, thick window layer is required to ensure effectively spreading the current to the edge of the LED chip.

Please refer to FIG. 2. FIG. 2 is a schematic diagram of a light emitting diode 20 with a current blocking structure 22. The dashed lines shown in FIG. 2 indicate the current flow. U.S. Pat. No. 5,048,035 proposed a current blocking structure 22 which can very effectively shift the drive current out the patterned portion of the upper electrode 24. But the current blocking structure 22 shown in FIG. 2 needs two steps epitaxial growth. Therefore, it is very difficult to grow the whole LED structure with high yield.

Please refer to FIG. 3. FIG. 3 is a schematic diagram of a light emitting diode 30 with a patterned metal contact 32. U.S. Pat. No. 4,884,370 proposed a light emitting diode 30 which has a dielectric layer 34 beneath a patterned metal contact 32 as shown in FIG. 3. The patterned metal contact 32 is insulated from the structure of the light emitting diode 30 to prevent current flow and subsequent light generation underneath the patterned metal contact 32. However, the dielectric layer 34 is placed directly below the patterned metal contact 32 and far away from an active layer (not shown) of the light emitting diode 30. Part of the current pushed away from the patterned metal contact 32 would be pulled back under the patterned metal contact 32. Therefore, it is not very effective to solve the current crowding problem. Besides, the contact region between the ohmic contact metal and the upper semiconductor layer is smaller than the ordinary light emitting diode 30. The contact resistance may increase due to the reduction of the contact area. If the adhesion between the dielectric layer 34 and the patterned metal contact 32 or between the dielectric layer 34 and the upper semiconductor layer is not good, it would also cause the peeling off problem of the patterned metal contact 32.

SUMMARY OF THE INVENTION

It is therefore a primary objective of the present invention to provide a method of manufacturing a light emitting diode with a current blocking structure to solve the above mentioned problem.

In the preferred embodiment, the present invention provides a method of manufacturing a light emitting diode based on an epitaxial layer structure. The epitaxial layer structure comprises a substrate of a first conductivity type, a lower cladding layer of the first conductivity type formed on a top side of the substrate, an active layer formed on the lower cladding layer, an upper cladding layer of a second conductivity type formed on the active layer, at least one upper aluminum-rich layer formed on the upper cladding layer, and a cap layer formed on the at least one upper aluminum-rich layer. The method comprises:

forming an opening hole in the epitaxial layer structure for passing through each upper aluminum-rich layer;

oxidizing a predetermined region of each upper aluminum-rich layer;

filling the opening hole with an insulating material; and forming an upper electrode on the cap layer and a lower electrode on a back side of the substrate.

It is an advantage of the present invention that the predetermined region can act as a current blocking structure so that the current can spread out of the predetermined region. Therefore, the light generated from the active layer will not be blocked by the upper electrode. The luminous intensity of the light emitting diode can be increased at least 50% compared to the light emitting diode without the current blocking structure.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
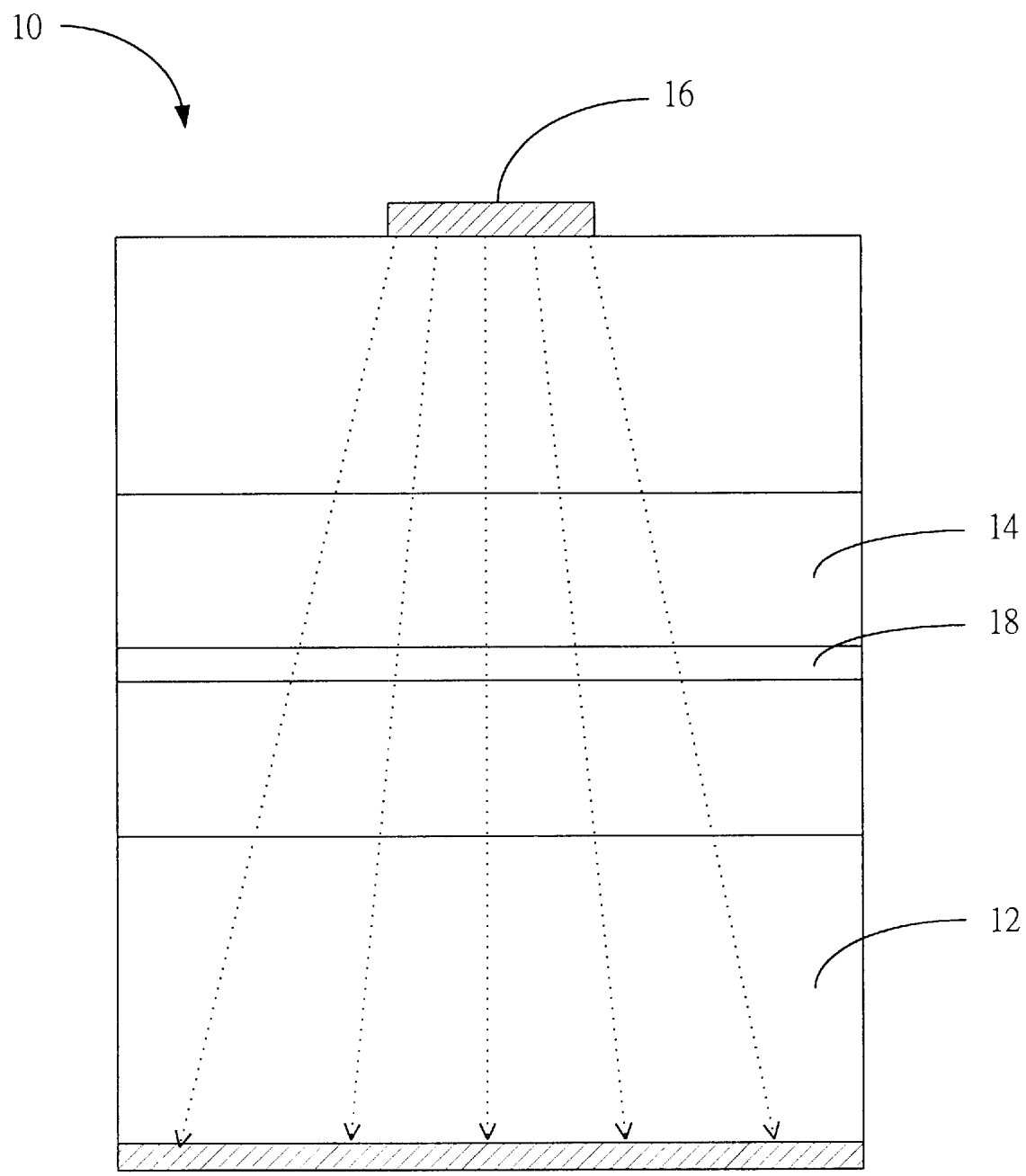
FIG. 1 is a schematic diagram of a light emitting diode according to the prior art.
Figure 2:
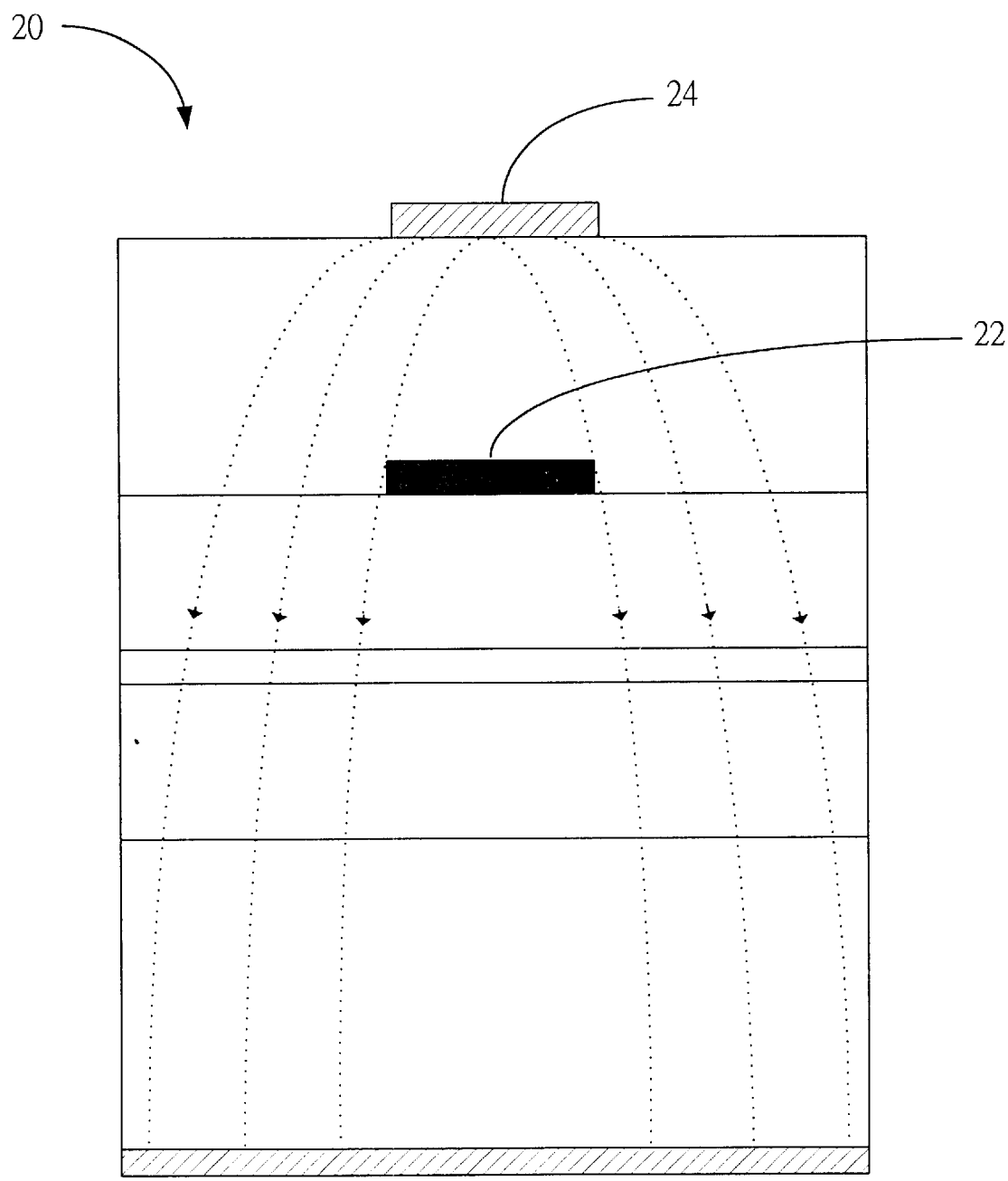
FIG. 2 is a schematic diagram of a light emitting diode with a current blocking structure.
Figure 3:
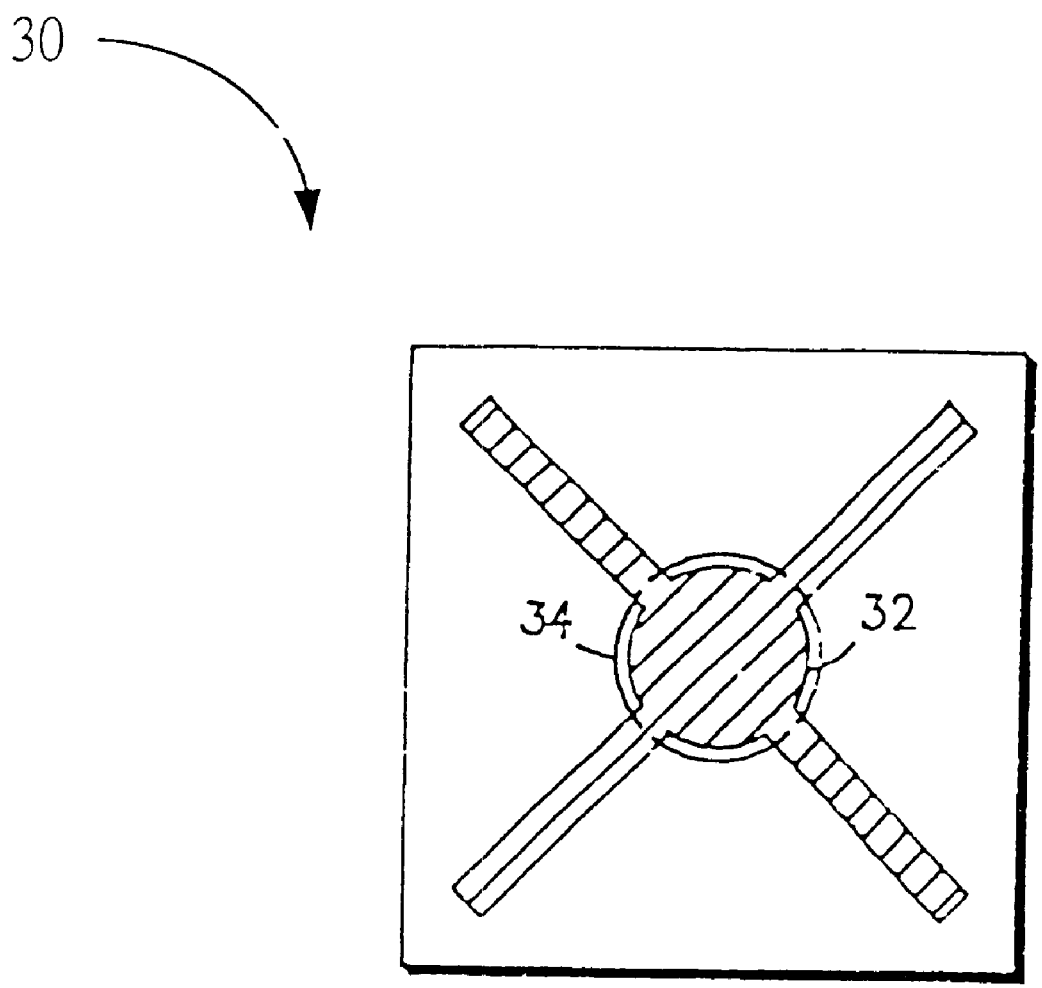
FIG. 3 is a schematic diagram of a light emitting diode with a patterned metal contact.
Figure 4:
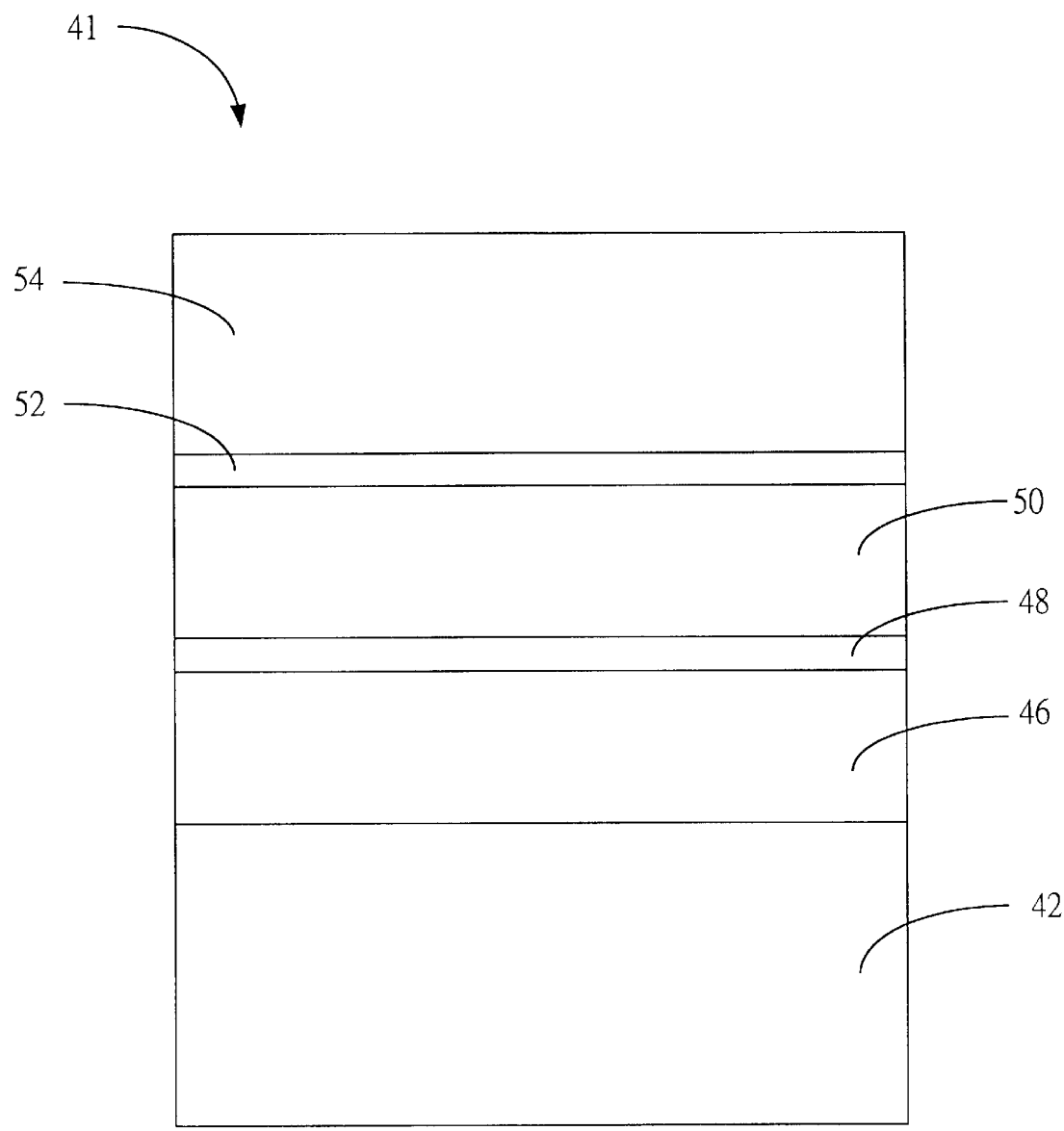
FIG. 4 is a schematic diagram of an epitaxial layer structure according to the present invention.
Figure 5:
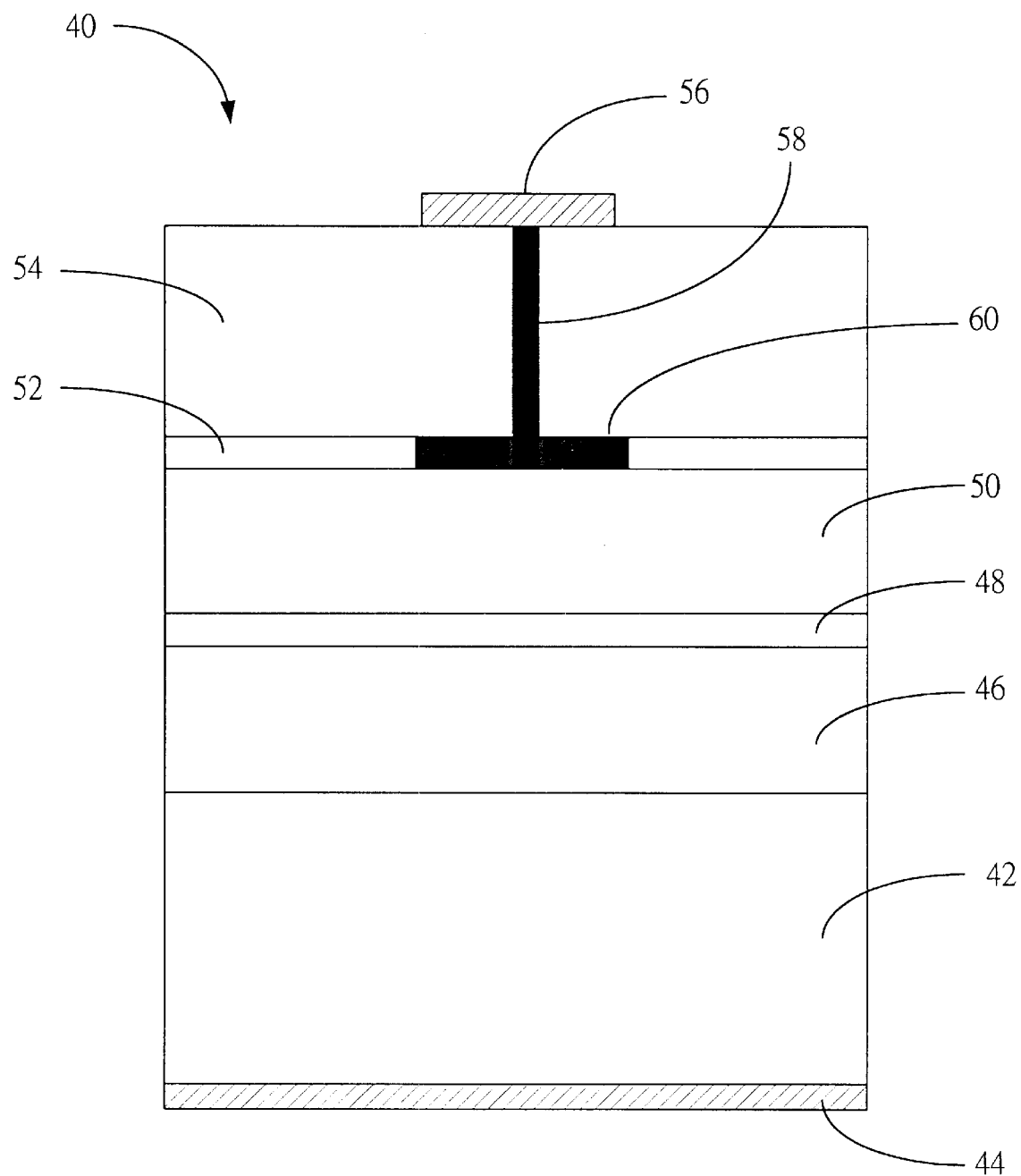
FIG. 5 is a schematic diagram of a light emitting diode according to a first embodiment of the present invention.

Please refer to FIGS. 4 and 5. FIG. 4 is a schematic diagram of an epitaxial layer structure 41 according to the present invention. FIG. 5 is a schematic diagram of a light emitting diode 40 according to a first embodiment of the present invention. The present invention provides a method of manufacturing a light emitting diode 40 based on an epitaxial layer structure 41. The epitaxial layer structure 41 of the. present invention includes a N-type GaAs substrate 42. A N-type $(Al_xGa_{1-x})_{0.51}In_{0.49}P$ with x=0.5~1 lower cladding layer 46 is formed on the substrate 42. An $(Al_xGa_{1-x})_{0.51}In_{0.49}P$ active layer 48 is formed on the lower cladding layer 46 and acts as a light emitting layer. Furthermore, the active layer 48 could be a multiple quantum well structure comprising a plurality of quantum well layers (not shown) and barrier layers (not shown) alternatively stacking one after the other. The active layer 48 of the present invention is made of $(Al_xGa_{1-x})_{0.51}In_{0.49}P$ with x=0~0.4 depending on the emission wavelength For example, when the aluminum content is equal to 15%, the emission wavelength of the light emitting diode 40 is about 610 nm. And then, a P-type $(Al_xGa_{1-x})_{0.51}In_{0.49}P$ upper cladding layer 50 is formed on the active layer 48. A p-type upper aluminum-rich layer 52 is formed on the upper cladding layer 50. The upper aluminum-rich layer 52 of the present invention is made of AlGaAs or AlGaInAs wherein the aluminum content is over 90%. Finally, a high bandgap, high conductivity P-type cap layer 54 is formed on the upper aluminum-rich layer 52. The cap layer 54 must have a bandgap larger than the active layer 48 in order that the light generated from the active layer 48 would not be absorbed by the cap layer 54. Besides, the cap layer 54 must also have higher conductivity in order to form the ohmic contact with lower contact resistance easily. P-type GaP and P-type GaAsP are all good candidates for the P-type cap layer 54. N-type GaP, n-type AlGaAs, n-type GaAsP, n-type AlGaP and n-type ZnSe are all good candidates for the N-type cap layer (not shown).

Figure 6:
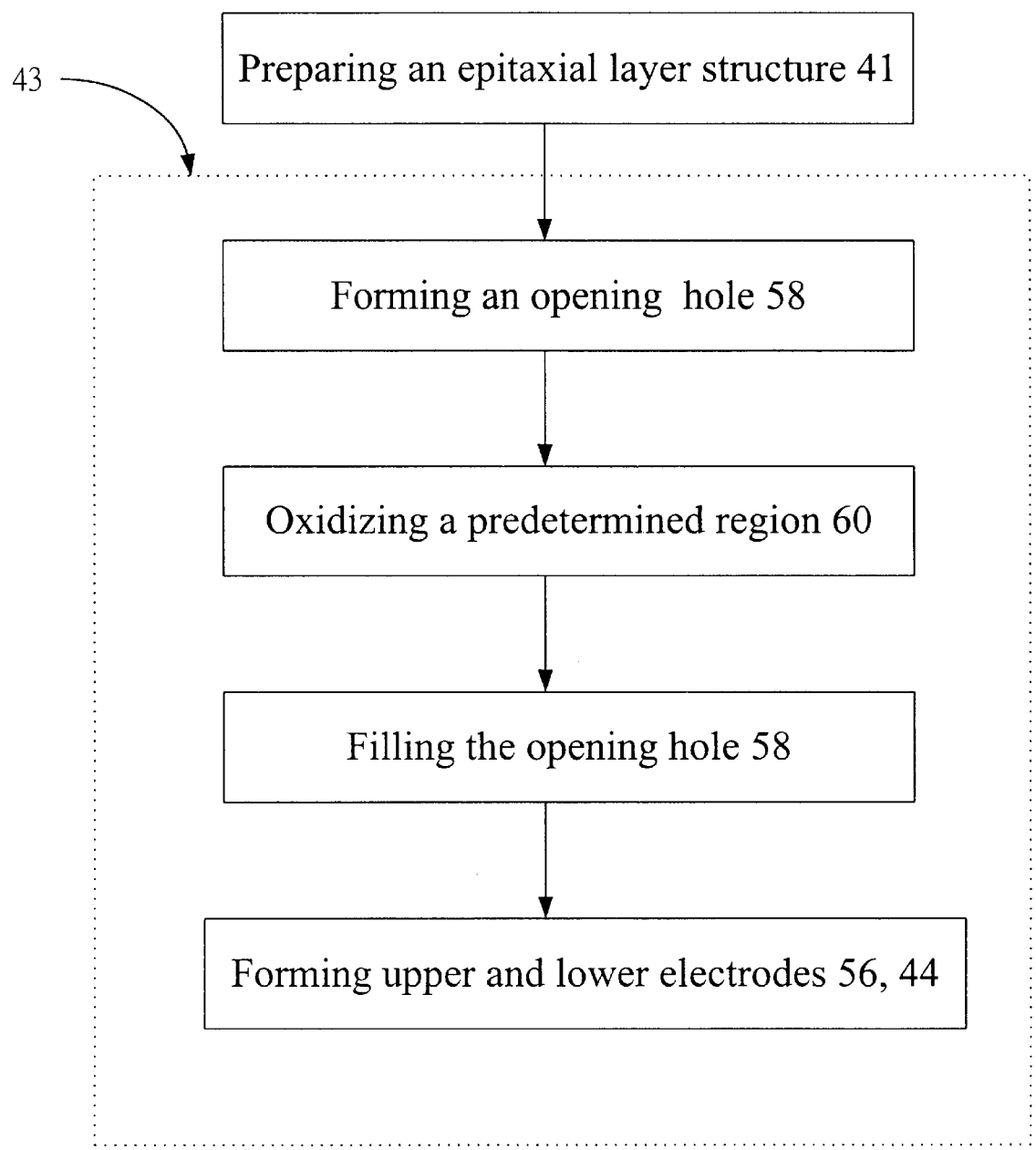
FIG. 6 is a flowchart showing a process for manufacturing the light emitting diode shown in FIG. 5.

Please refer to FIG. 6. FIG. 6 is a flowchart showing a process 43 for manufacturing the light emitting diode 40 shown in FIG. 5. After the growth of the above epitaxial layer structure 41, a opening hole 58 with diameter about 2~50 μm is formed in the center of the epitaxial layer structure 41. The depth of the opening hole 58 must be deep enough to pass through the upper aluminum-rich layer 52. If the diameter of the opening hole 58 is too small, it would be very difficult to etch the opening hole 58 deeply or later clean the etching solution residue thoroughly. If the opening hole 58 is too big, it would be very difficult to bond the gold wire (not shown) on the bonding pad (not shown) without bonding pad peeling off problem. The etching of the opening hole 58 can use either chemical etching solution or reactive ion etching method. After etching the opening hole 58, a predetermined region 60 of the upper aluminum-rich layer 52 is oxidized by a high temperature water vapor for a period of time. To avoid the P/N junction short circuit, the opening hole 58 is then filled with an insulating material such that SOG (spin on glass) or a thin layer of $SiO_2$ or $Si_3N_4$ is deposited in the inner surface of the cylindrical opening hole 58. A circular upper electrode 56 is then formed on the cap layer 54 and a lower electrode 44 is formed on a back surface of the GaAs substrate 42. The diameter of the upper electrode 56 is a little smaller than the diameter of the predetermined region 60. The predetermined region 60, underneath the upper electrode 56, can act as a current blocking structure so that the current can spread out of the predetermined region 60. The luminous intensity of the light emitting diode 40 with the predetermined region 60 can be increased at least 50% compared to the LED without the current blocking structure. In the above embodiment, the upper aluminum-rich layer 52 is used as the oxidation layer but other materials that are easily to form stable aluminum oxide can be used as good oxidation layers such as high aluminum content AlP, AlInP, AlGaP, AlInAs and AlGaInP materials.

Figure 7:
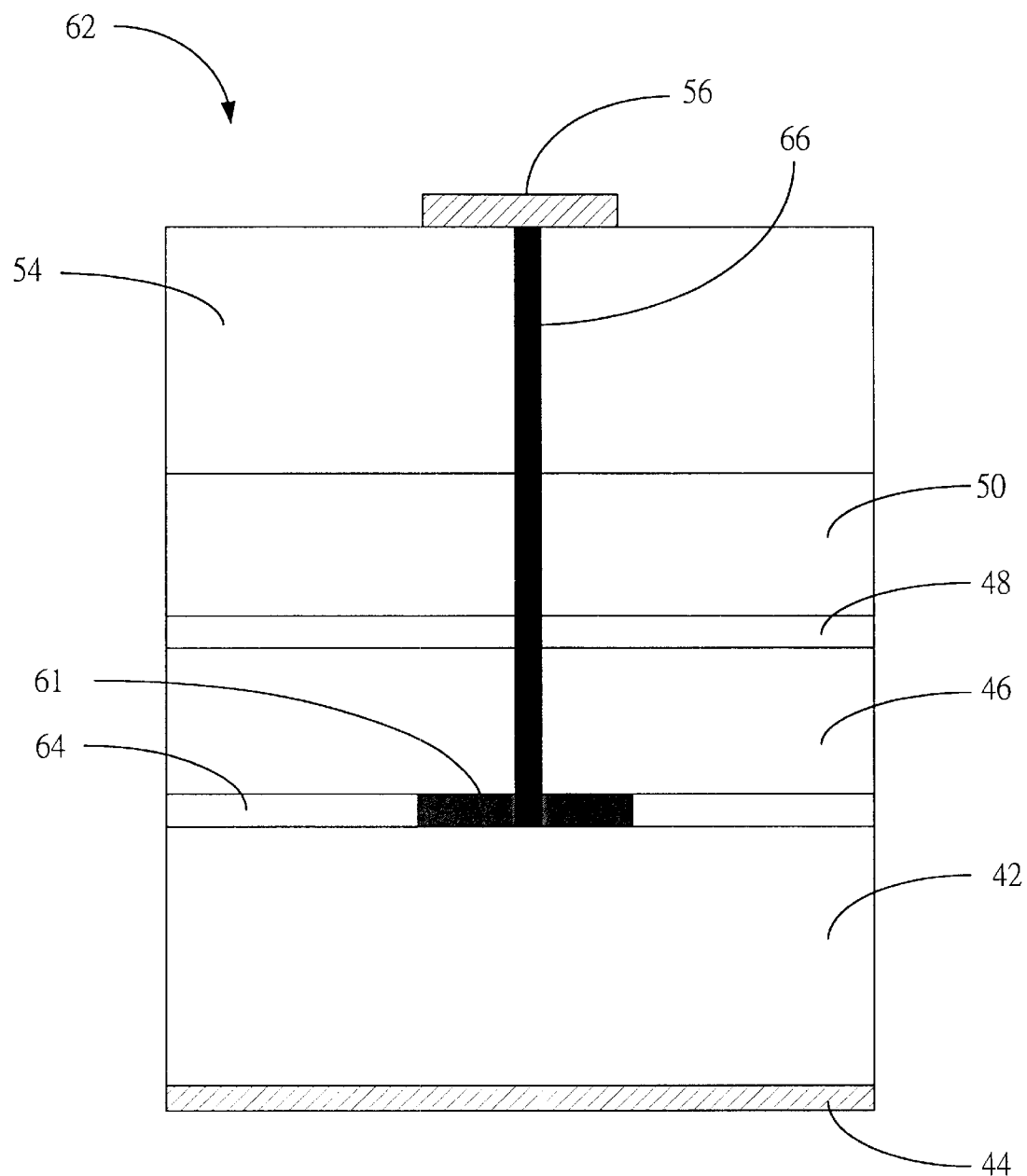
FIG. 7 is a schematic diagram of a light emitting diode according to a second embodiment of the present invention.

Please refer to FIG. 7. FIG. 7 is a schematic diagram of a light emitting diode 62 according to a second embodiment of the present invention. It is also not necessary that the oxidation layer must be inserted between the active layer 48 and upper electrode 56. Even though the oxidation layer is placed beneath the active layer 48, it is still effective to block the current flow under the upper electrode 56 as long as the oxidation layer is close to the active layer 48. In this embodiment, a n-type lower aluminum-rich layer 64 acting as the oxidation layer is formed between the n-type GaAs substrate 42 and the n-type lower cladding layer 46. Besides, an opening hole 66 must pass through the active layer 48 and reach the lower aluminum-rich layer 64 as shown in FIG. 7. A predetermined region 61 of the lower aluminum-rich layer 64 is oxidized by a high temperature water vapor for a period of time. The current blocking effect resulting from the predetermined region 61 of the lower aluminum-rich layer 64 is even better.

Figure 8:
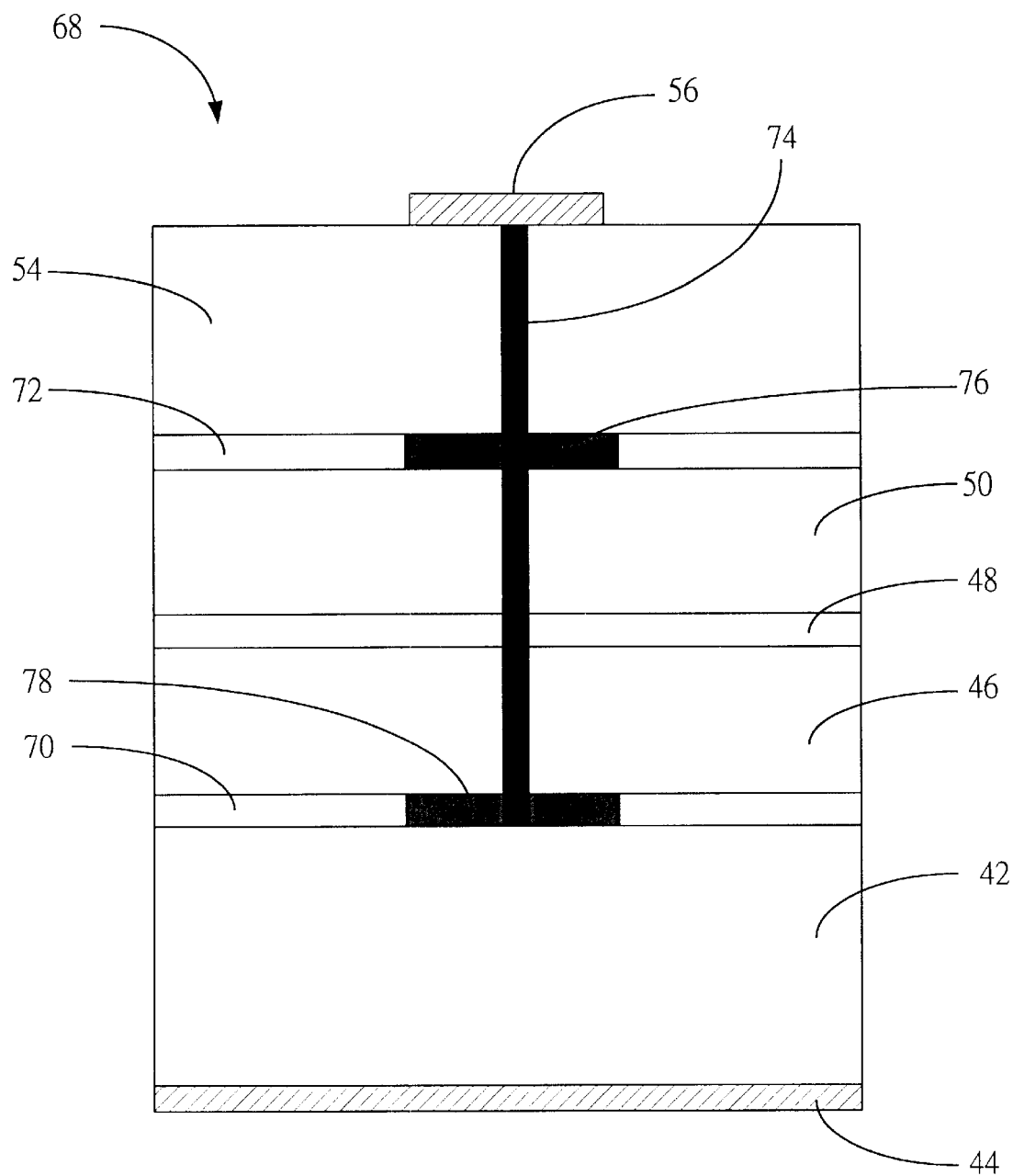
FIG. 8 is a schematic diagram of a light emitting diode according to a third embodiment of the present invention.

Please refer to FIG. 8. FIG. 8 is a schematic diagram of a light emitting diode 68 according to a third embodiment of the present invention. In this embodiment, a n-type lower aluminum-rich layer 70 is formed between the n-type GaAs substrate 42 and the n-type lower cladding layer 46. A p-type upper aluminum-rich layer 72 is formed between the p-type upper cladding layer 50 and the p-type high bandgap low resistivity cap layer 54. Besides, an opening hole 74 must pass through the p-type upper aluminum-rich layer 72 and the active layer 48, and reach the n-type lower aluminum-rich layer 70 as shown in FIG. 8. A predetermined region 78 of the lower aluminum-rich layer 70 and a predetermined region 76 of the upper aluminum-rich layer 72 are oxidized by a high temperature water vapor for a period of time. Because the active layer 48 that is beneath the upper electrode 56 is sandwiched by the predetermined regions 76, 78, the current blocking effect is even better.

Figure 9:
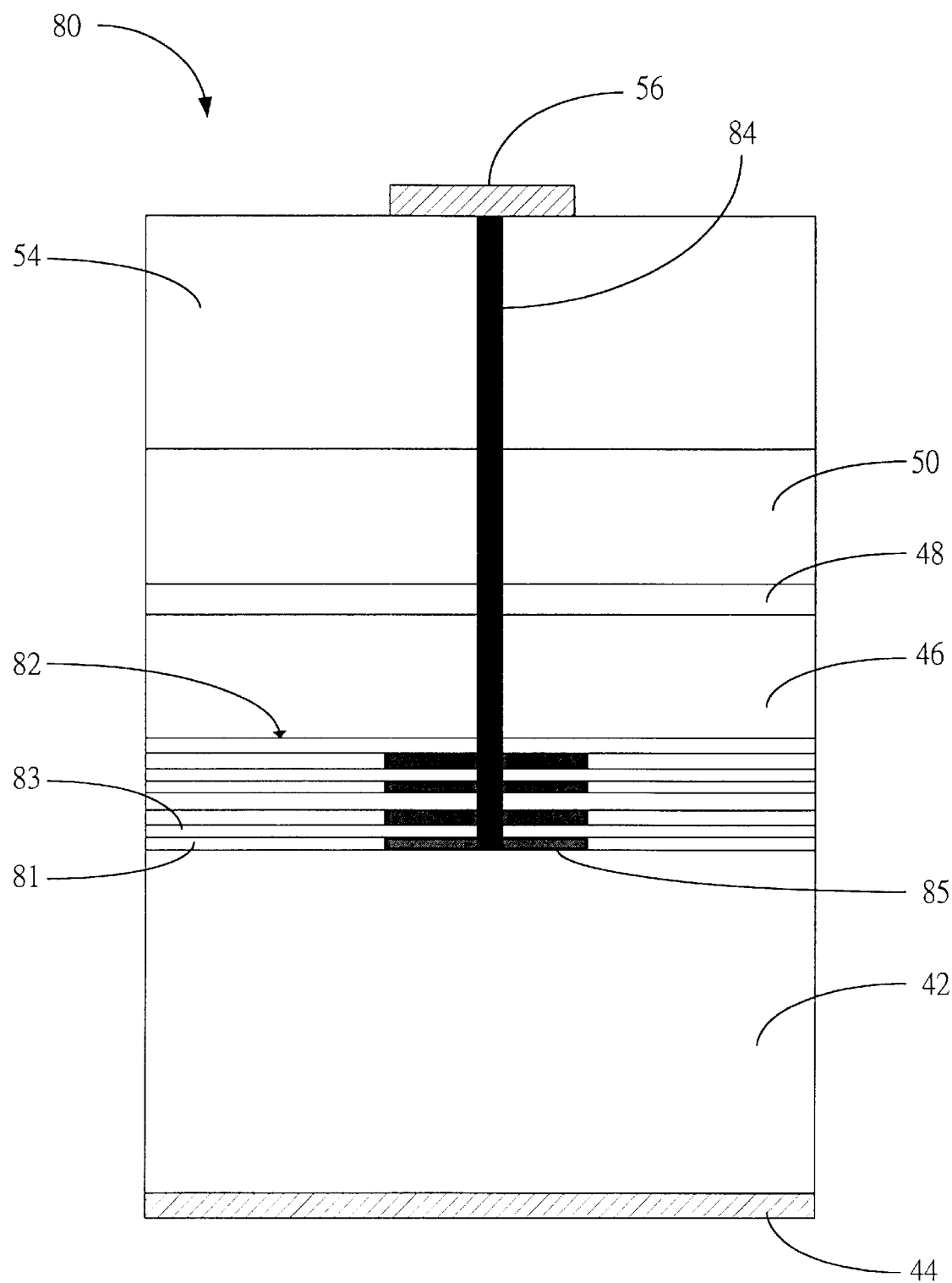
FIG. 9 is a schematic diagram of a light emitting diode according to the fourth embodiment of the present invention.
Figure 10:
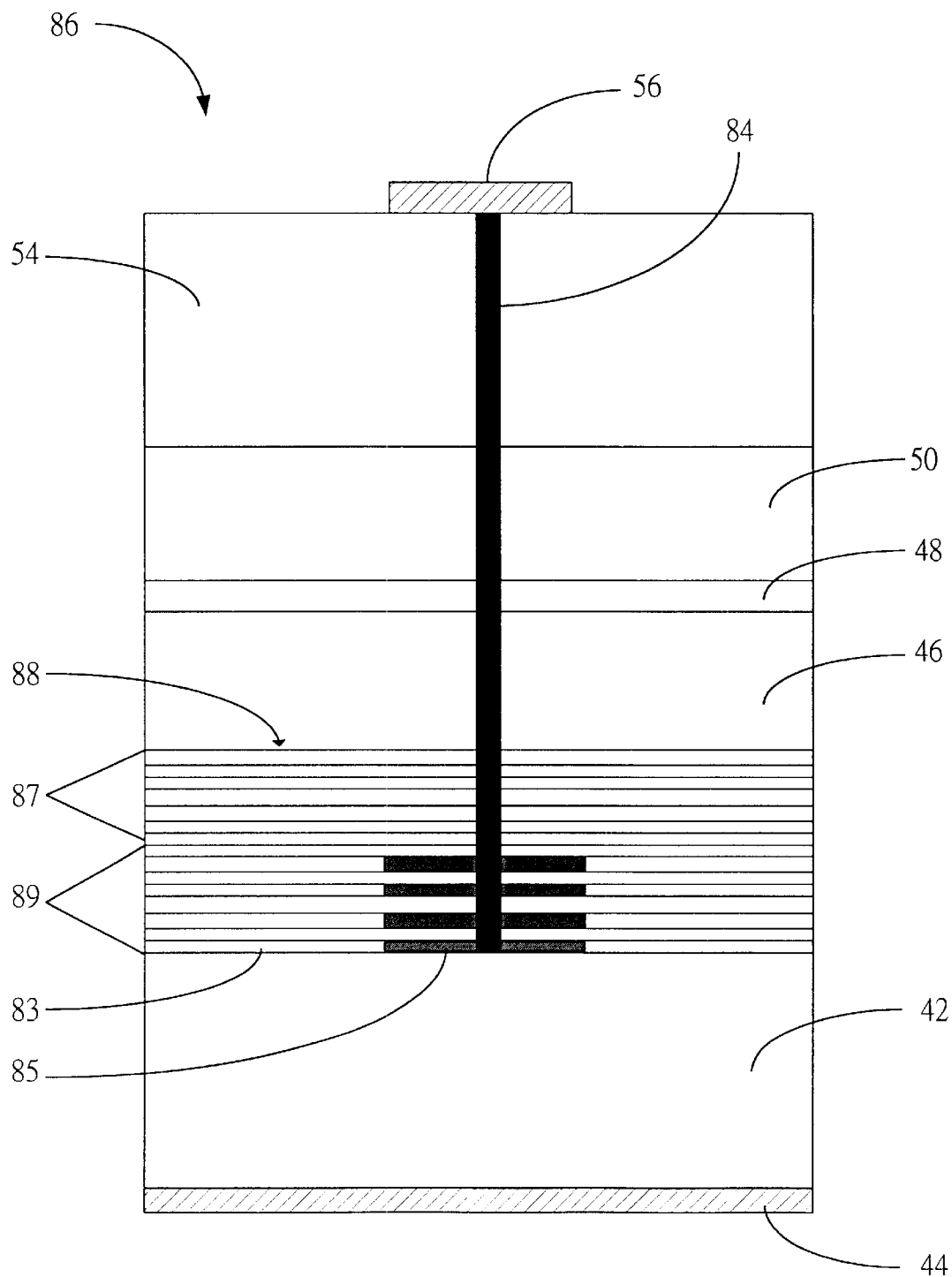
FIG. 10 is a schematic diagram of a light emitting diode according to the fifth embodiment of the present invention.

Please refer to FIGS. 9 and 10. FIG. 9 is a schematic diagram of a light emitting diode 80 according to the fourth embodiment of the present invention. FIG. 10 is a schematic diagram of a light emitting diode 86 according to the fifth embodiment of the present invention. In the fourth embodiment of the present invention, a light emitting diode 80 further comprises a n-type AlAs/GaAs distributed Bragg reflector (DBR) 82 formed between the n-type GaAs substrate 42 and the n-type AlGaInP lower cladding layer 46. The distributed Bragg reflector 82 comprises a plurality of AlAs layers 81 and a plurality of GaAs layers 83 alternatively stacking one after the other. Each AlAs layer 81 with high aluminum content can act as the lower aluminum-rich layer of the present invention. An opening hole 84 must pass through the active layer 48 and reach the distributed Bragg reflector 82. A predetermined region 85 of each AlAs layer 81 is oxidized by a high temperature water vapor for a period of time as shown in FIG. 9. Besides, other materials that have high aluminum content can be used as one kind of the layer in the distributed Bragg reflector 82. For example, an AlInP/InGaP DBR can be oxidized and used to block the current. To have the current blocking effect, it is not necessary that all of the high aluminum content layer must be oxidized. In the fifth embodiment of the present invention, a hybrid DBR structure 88 comprising an AlInP/InGaP layer 87 and an AlAs/GaAs layer 89 is applied to a light emitting diode 86, and only a predetermined region 85 of each AlAs layer 83 is oxidized for acting as the current blocking structure as shown in FIG. 10.

Figure 11:
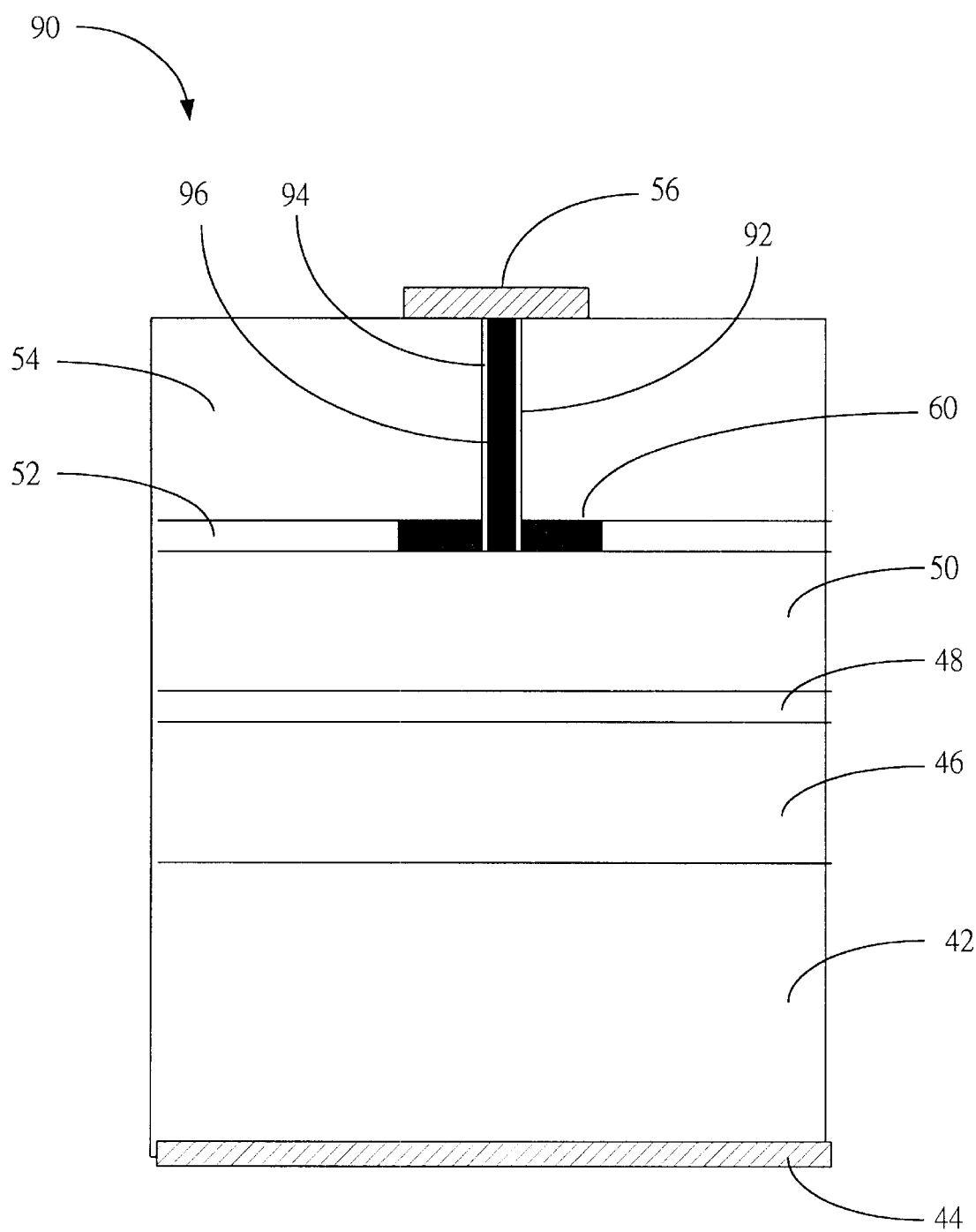
FIG. 11 is a schematic diagram of a light emitting diode according to the sixth embodiment of the present invention.

Please refer to FIG. 11. FIG. 11 is a schematic diagram of a light emitting diode 90 according to the sixth embodiment of the present invention. To further enhance the luminous intensity of a light emitting diode 90, the inner surface of the opening hole 92 after deposition of a $SiO_2$ or $Si_3N_4$ film 94 is plated or deposited with a thick gold layer 96 as shown in FIG. 11. The gold layer 96 would help to reflect the light that is emitted towards the opening hole 92, therefore, increasing the light output. The Au metal buried inside the opening hole 92 connecting with the upper electrode 56 and the bonding pad (not shown) also would make the bonding pad sticking with the semiconductor more strong and not easy to peel off during the bonding process. Besides, gold is a good thermal conductor and also help to dissipate the heat and improve the device reliability.

Figure 12:
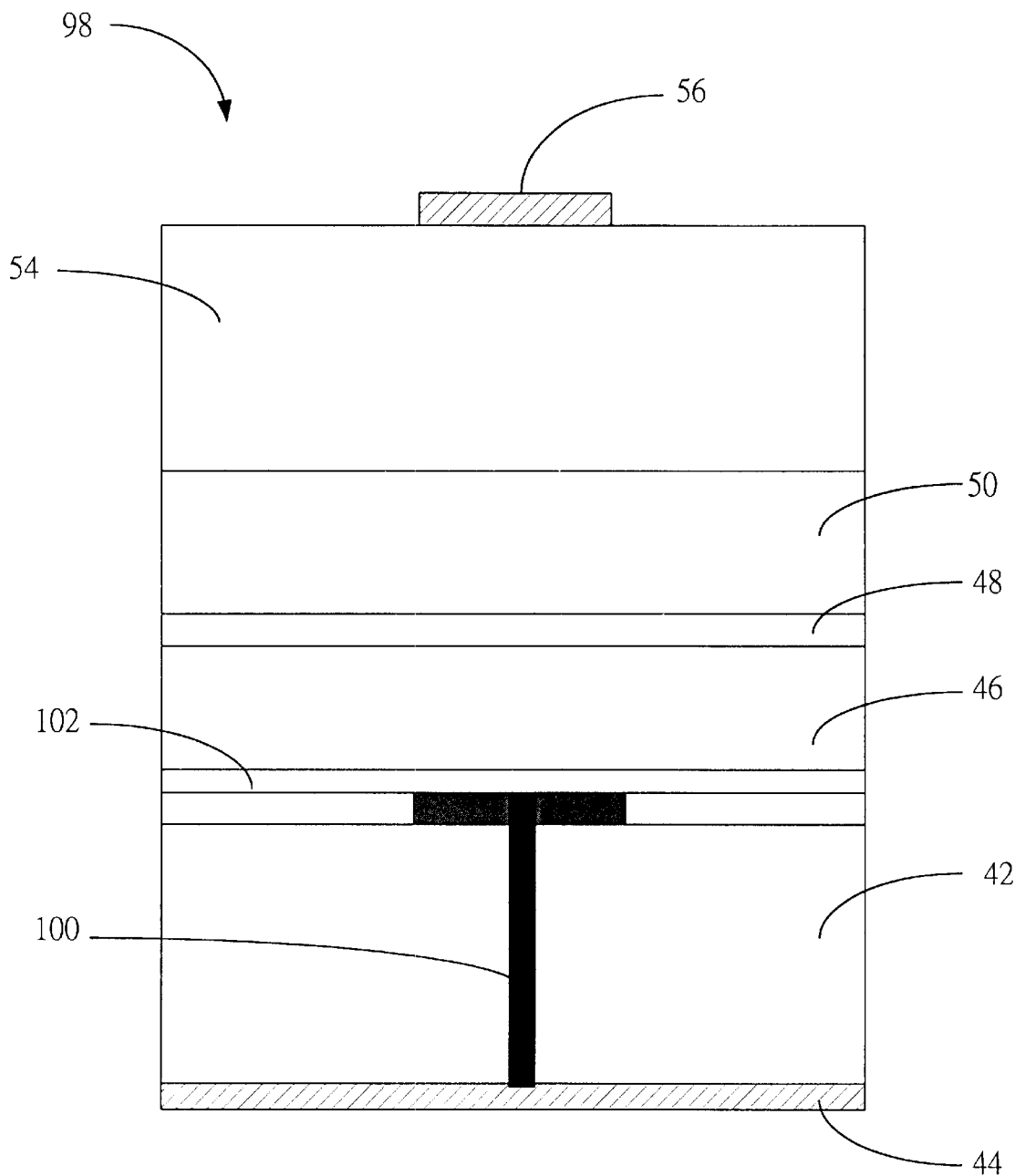
FIG. 12 is a schematic diagram of a light emitting diode according to the seventh embodiment of the present invention.

Please refer to FIG. 12. FIG. 12 is a schematic diagram of a light emitting diode 98 according to the seventh embodiment of the present invention. In this embodiment, an opening hole 100 also can be opened from the bottom surface of a light emitting diode 98 as shown in FIG. 12. The only difficulty in this embodiment is that it takes a long time to etch a deep opening hole 100. Therefore, it is more difficult to control the etching depth uniformly in the whole wafer (not shown). In order to accurately control the etching depth, normally an etching stop layer 102 must be designed in the light emitting diode 98 as shown in FIG. 12.

Figure 13:
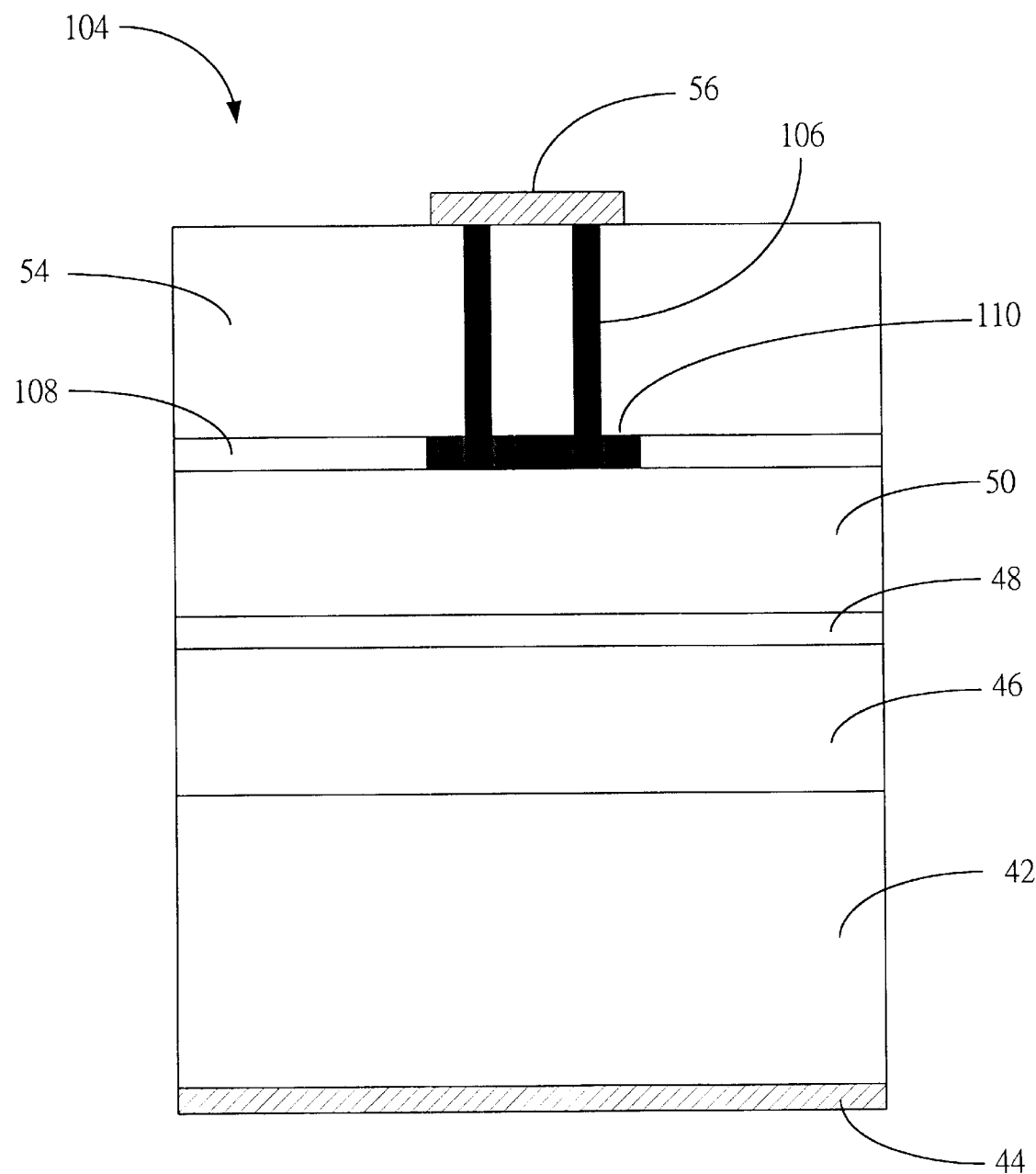
FIG. 13 is a schematic diagram of a light emitting diode according to the eighth embodiment of the present invention.

Please refer to FIG. 13. FIG. 13 is a schematic diagram of a light emitting diode 104 according to the eighth embodiment of the present invention. In this embodiment, after growing the whole epitaxial layer structure 41 similar to FIG. 4, a ring-shaped opening hole 106 with diameter about 50 $\mu$m and width 2~20 $\mu$m is formed by etching. The predetermined region 110 of the upper aluminum-rich layer 108 is oxidized along two directions both radially inward and outward. Therefore, the oxidation time needed in the ring-shaped opening hole 106 can be half of the central opening hole 58 as shown in FIG. 5.

Figure 14:
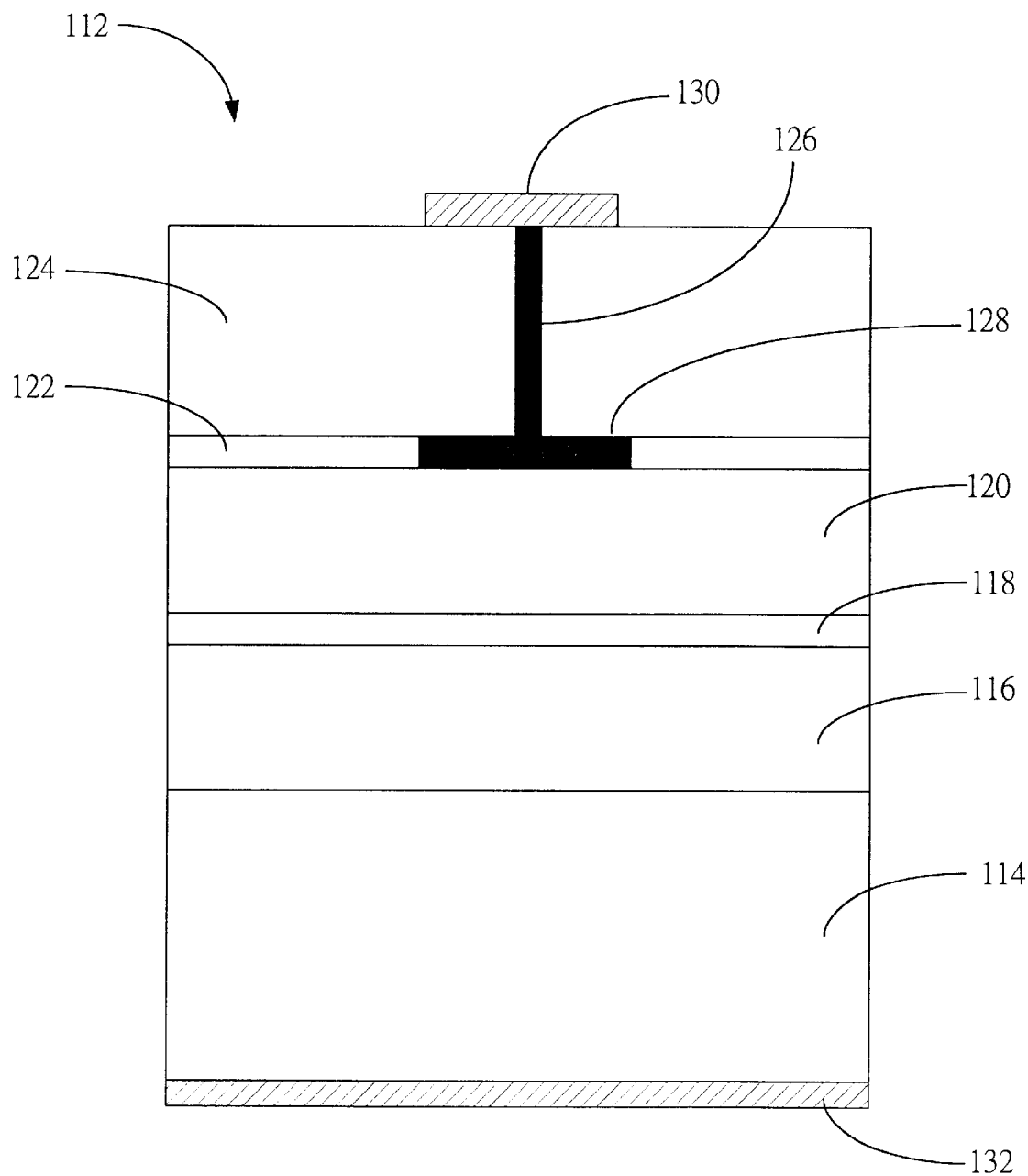
FIG. 14 is a schematic diagram of a light emitting diode according to the ninth embodiment of the present invention.

Please refer to FIG. 14. FIG. 14 is a schematic diagram of a light emitting diode 112 according to the ninth embodiment of the present invention. The current blocking structure not only is effective for the AlGaInP LEDs but also can be used for the AlGaAs red, AlGaAs and InGaAs infrared LEDs. In this embodiment, a 650 nm AlGaAs red light emitting diode (LED) 112 is shown in FIG. 14. The structure of the 650 nm AlGaAs red LED 112 comprises a first conductivity GaAs substrate 114. An $Al_{0.8}Ga_{0.2}As$ lower cladding layer 116 of the first conductivity type is grown on the GaAs substrate 114. Above the lower cladding layer 116 is an undoped $Al_{0.35}Ga_{0.65}As$ active layer 118. The thickness of this active layer 118 is about 0.5~1 $\mu$m. An $Al_{0.8}Ga_{0.2}As$ upper cladding layer 120 of the second conductivity type is then grown on the active layer 118. Above the upper cladding layer 120 is an $Al_{0.95}Ga_{0.05}As$ upper aluminum-rich layer 122. Finally, a high bandgap and low resistivity $Al_xGa_{1-x}As$ cap layer 124 with x=0.4~0.6 which has a bandgap larger than the active layer 118 would not absorb the light generated from the active layer 118. The cap layer 124 with a smaller bandgap than the upper cladding layer 120 would have a high carrier concentration and lower resistivity. The lower resistivity of the cap layer 124 certainly would make the formation of ohmic contact much more easily. After the growth of the above epitaxial layer structure, an opening hole 126 with diameter about 2~50 $\mu$m is formed in the center of the LED chip. The depth of the opening hole 126 must be deeper enough to pass through the upper aluminum-rich layer 122. Moreover, a predetermined region 128 of the upper aluminum-rich layer 122 is oxidized in a water vapor atmosphere at a temperature above 200 degree centigrade for a period of time. To avoid the P/N junction short circuit, the opening hole 126 is then filled with an insulating material such as SOG (spin on glass), or a thin layer of $SiO_2$ or $Si_3N_4$ is deposited in the cylindrical inner surface of the opening hole 126. A circular upper electrode 130 is then formed on the cap layer 124 and a back electrode 132 is formed on the back surface of the GaAs substrate 114. The diameter of the circular upper electrode 130 is a little smaller than the diameter of the predetermined region 128. The luminous intensity of the light emitting diode 112 with the predetermined region 128 acting as the current blocking structure can be increased at least 50% compared to the LED without the current blocking structure. The luminous intensity of the 650 nm AlGaAs LED 112 can be further increased by forming an AlGaAs/AlAs distributed Bragg reflector (not shown) between the GaAs substrate 114 and the lower cladding layer 116 to reflect the light that is emitted towards the GaAs substrate 114.

Figure 15:
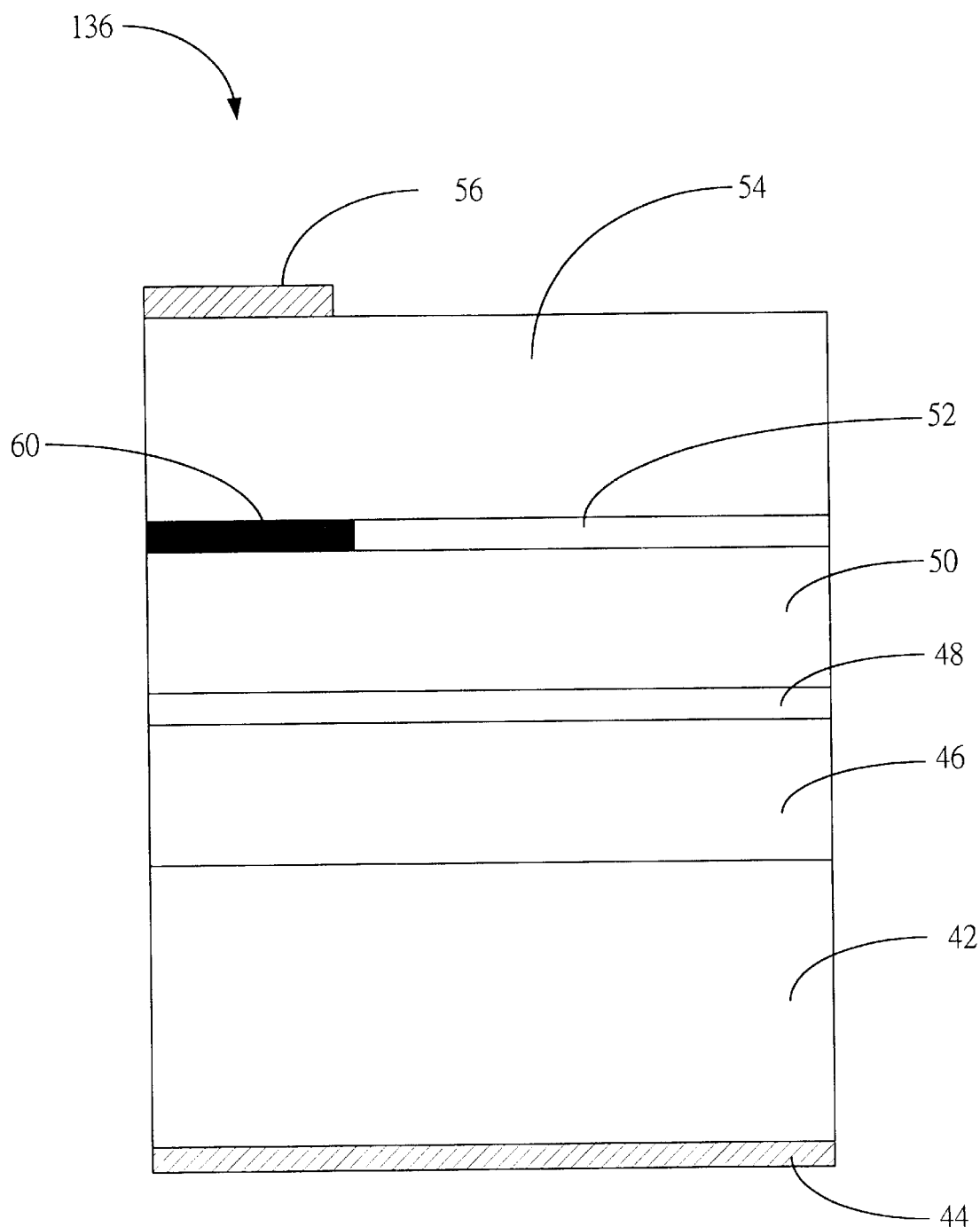
FIG. 15 is a schematic diagram of a light emitting diode according to the tenth embodiment of the present invention.
Figure 16:
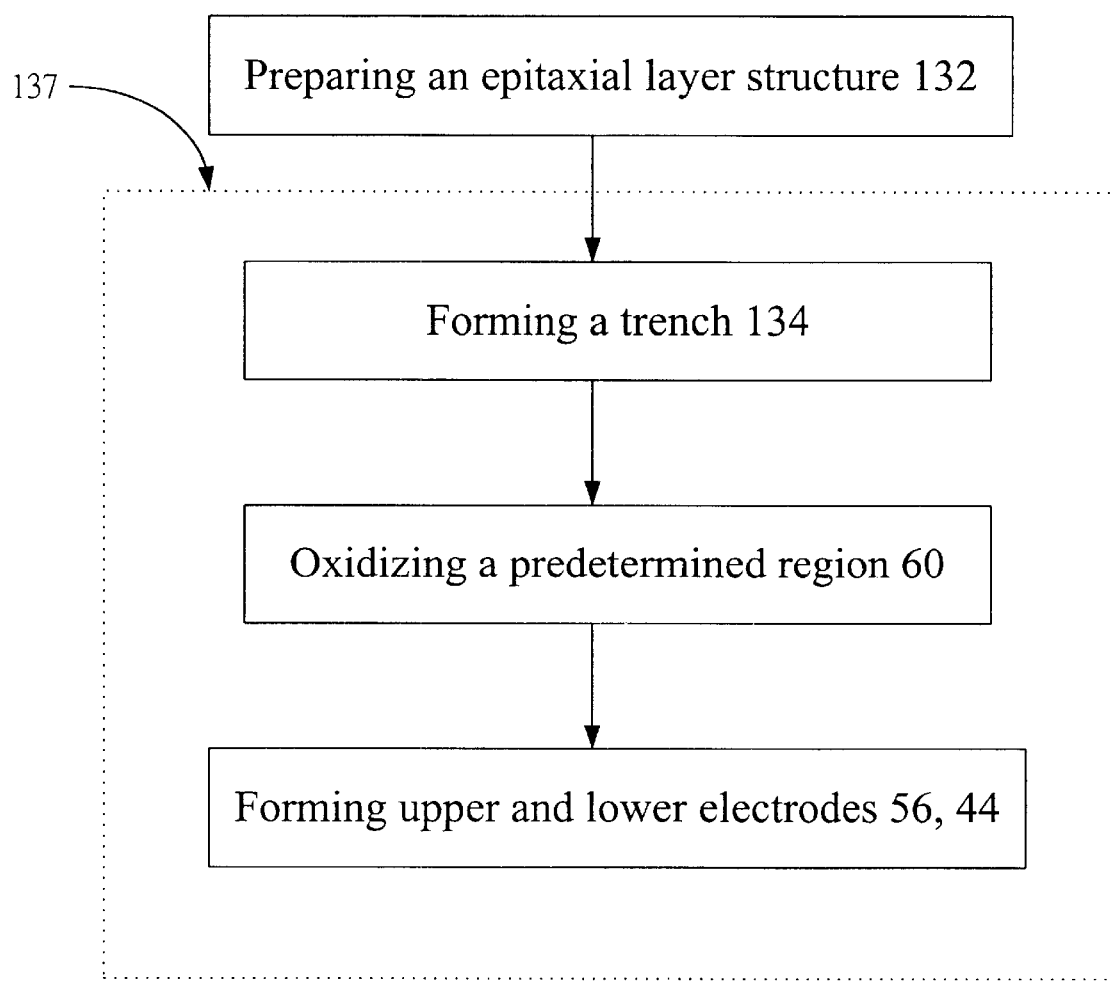
FIG. 16 is a flowchart showing a. process for manufacturing the light emitting diode shown in FIG. 15.
Figure 17:
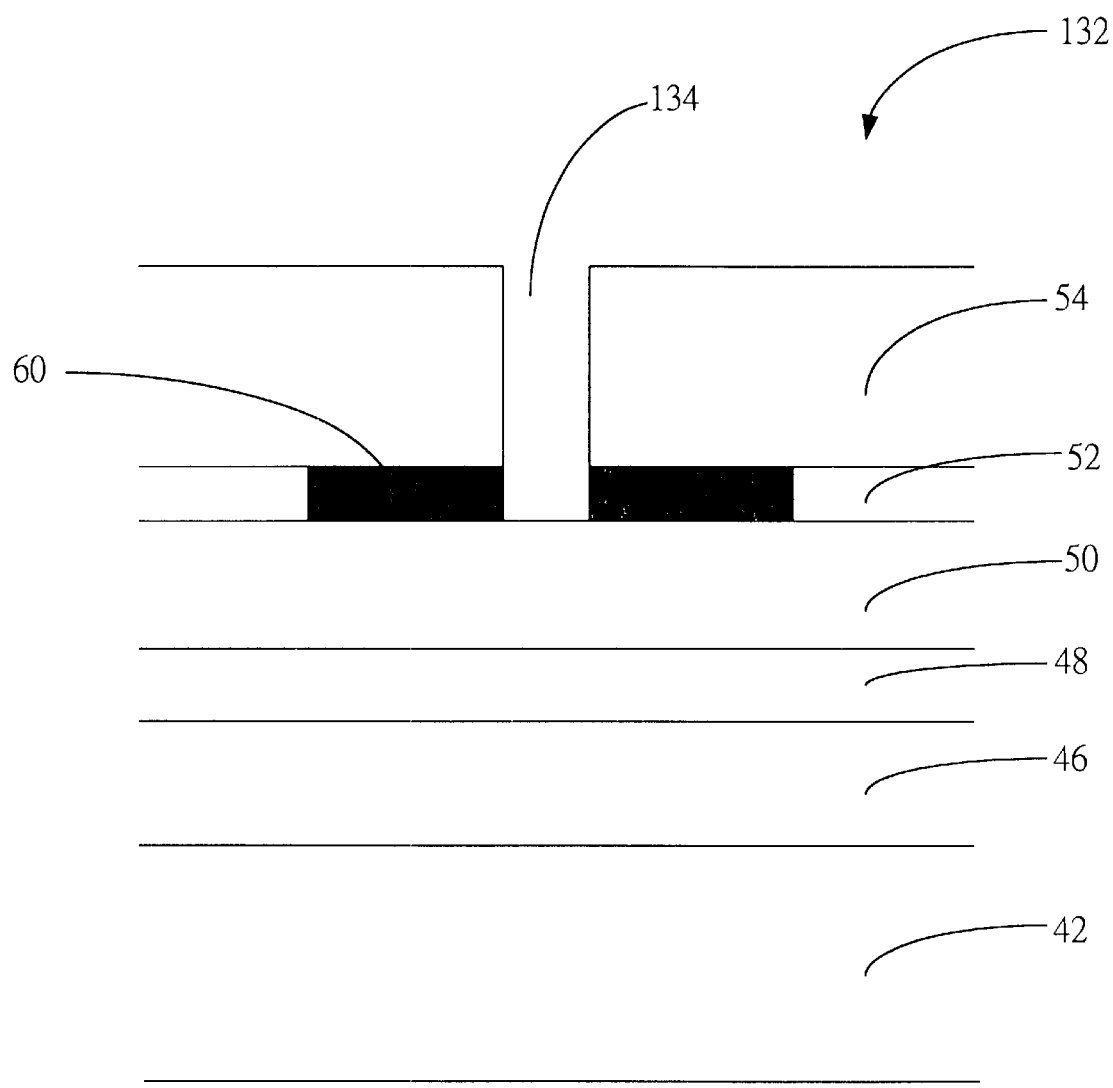
FIG. 17 is a schematic diagram of an epitaxial layer structure with a trench.
Figure 18A:
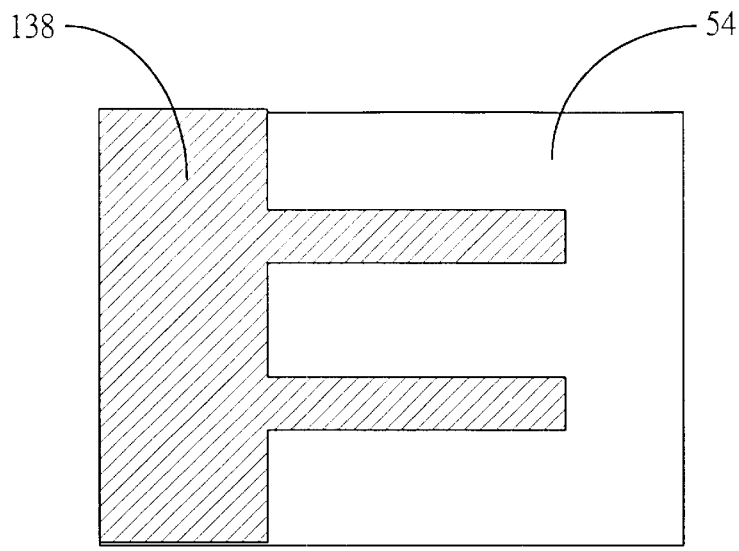
FIGS. 18(a)–(c) are top views of the different upper electrodes according to the tenth embodiment of the present invention.
Figure 18B:
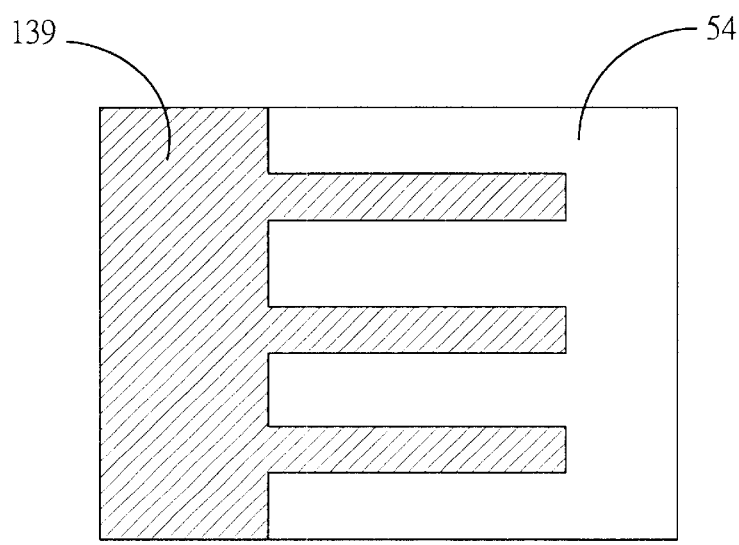
Figure 18C:
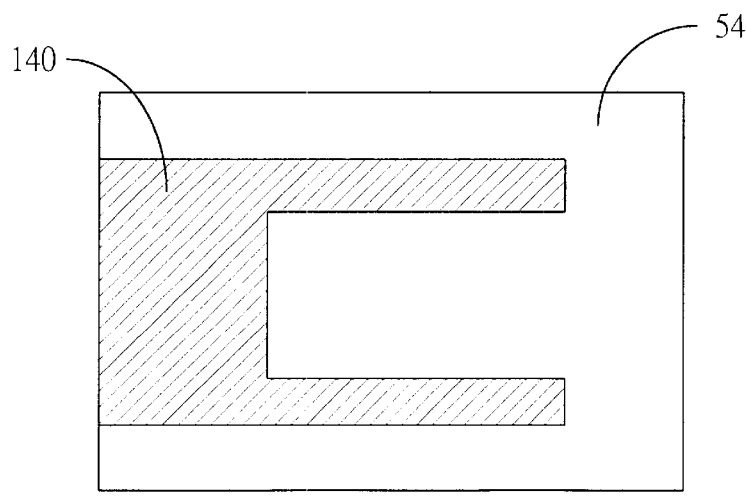

Please refer to FIGS. 15, 16, 17 and 18(*a*)~(*c*). FIG. 15 is a schematic diagram of a light emitting diode 136 according to the tenth embodiment of the present invention. FIG. 16 is a flowchart showing a process 137 for manufacturing the light emitting diode 136 shown in FIG. 15. FIG. 17 is a schematic diagram of an epitaxial layer structure 132 with a trench 134. FIG. 18(*a*)~(*c*) are top views of the different upper electrodes 56 according to the tenth embodiment of the present invention. In this embodiment, after growing the whole epitaxial layer structure 132 shown in FIG. 17, a trench 134 with about 0.2~4 mil is formed in period of 20~60 mil that can accommodate two chips. The depth of the trench 134 must be deep enough to pass through the upper aluminum-rich layer 52. If the trench 134 is too narrow, it will be very difficult to etch the trench 134 deeply or later clean the etching solution residue thoroughly. The method of etching can use either chemical etching solution or reactive ion etching method. After etching the trench 134, a predetermined region 60 of the upper aluminum-rich layer 52 is oxidized by a high temperature water vapor for a period of time. An upper electrode 56 is then formed on the cap layer 54 above the predetermined region 60 and a lower electrode 44 is formed on a back surface of the GaAs substrate 42. As shown in FIGS. 18(*a*)~(*c*), the geometry of the upper electrode 56 can be selected from the group consisting of the electrodes 138, 139, 140. Finally, a cut is applied between trenches 134 for dividing chips to form the light emitting diode 136 shown in FIG. 15. The predetermined region 60, underneath the upper electrode 56, can act as a current blocking structure so that the current can spread out of the predetermined region 60. The luminous intensity of the light emitting diode 136 with the predetermined region 60 can be increased at least 50% compared to the LED without the current blocking structure.

In contrast to the light emitting diodes 10, 20, 30 of the prior art, the present invention provides methods of manufacturing the light emitting diodes 40, 62, 68, 80, 86, 90, 98, 104, 112, 136 with at least one upper aluminum-rich layer or at least one lower aluminum-rich layer respectively. The predetermined region of the upper aluminum-rich layer or the lower aluminum-rich layer is then oxidized. It is an advantage of the present invention that the oxidized predetermined region can serve as a current blocking structure so that the current can spread out of the predetermined region. Therefore, the light generated from the active layer will not be blocked by the upper electrode. The luminous intensity of the light emitting diode 40, 62, 68, 80, 86, 90, 98, 104, 112, 136 can be increased at least 50% compared to the light emitting diode without the current blocking structure.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of manufacturing a light emitting diode based on an epitaxial layer structure, the epitaxial layer structure comprising a substrate of a first conductivity type, a lower cladding layer of the first conductivity type formed on a top side of the substrate, an active layer formed on the lower cladding layer, an upper cladding layer of a second conductivity type formed on the active layer, at least one upper aluminum-rich layer formed on the upper cladding layer, and a cap layer formed on the at least one upper aluminum-rich layer, the method comprising:

forming a columnar opening hole in the epitaxial layer structure for passing through each upper aluminum-rich layer;

oxidizing a predetermined region of each upper aluminum-rich layer;

filling the columnar opening hole with an insulating material; and forming an upper electrode on the cap layer and a lower electrode on a back side of the substrate.

2. The method of claim 1 wherein the predetermined region of each upper aluminum-rich layer is underneath the upper electrode.

3. The method of claim 2 wherein each upper aluminum-rich layer is formed of a material selected from the group consisting of AlGaAs, AlGaInAs, AlP, AlInP, AlGaP, AlInAs and AlGaInP.

4. The method of claim 3 wherein the aluminum content of each upper aluminum-rich layer is over 90%.

5. The method of claim 1 wherein the active layer is a multiple quantum well structure, the multiple quantum well structure comprises a plurality of quantum well layers and barrier layers alternatively stacking one after the other.

6. A method of manufacturing a light emitting diode based on an epitaxial layer structure, the epitaxial layer structure comprising a substrate of a first conductivity type, at least one lower aluminum-rich layer formed on a top side of the substrate, a lower cladding layer of the first conductivity type formed on the at least one lower aluminum-rich layer, an active layer formed on the lower cladding layer, an upper cladding layer of a second conductivity type formed on the active layer, and a cap layer formed on the upper cladding layer, the method comprising:

forming a columnar opening hole in the epitaxial layer structure for passing through each lower aluminum-rich layer;

oxidizing a predetermined region of each lower aluminum-rich layer;

filling the columnar opening hole with an insulating material; and forming an upper electrode on the cap layer and a lower electrode on a back side of the substrate.

7. The method of claim 6 wherein the predetermined region of each lower aluminum-rich layer is underneath the upper electrode.

8. The method of claim 7 wherein the lower aluminum-rich layer is formed of a material selected from the group consisting of AlGaAs, AlGaInAs, AlP, AlInP, AlGaP, AlInAs and AlGaInP.

9. The method of claim 8 wherein the aluminum content of each lower aluminum-rich layer is over 90%.

10. The method of claim 6 wherein the active layer is a multiple quantum well structure, the multiple quantum well structure comprises a plurality of quantum well layers and barrier layers alternatively stacking one after the other.

11. A method of manufacturing a light emitting diode based on an epitaxial layer structure, the epitaxial layer structure comprising a substrate of a first conductivity type, at least one lower aluminum-rich layer formed on a top side of the substrate, a lower cladding layer of the first conductivity type formed on the at least one lower aluminum-rich layer, an active layer formed on the lower cladding layer, an upper cladding layer of a second conductivity type formed on the active layer, at least one upper aluminum-rich layer formed on the upper cladding layer, and a cap layer formed on the at least one upper aluminum-rich layer, the method comprising:

forming a columnar opening hole in the epitaxial layer structure for passing through each lower aluminum-rich layer and each upper lower aluminum-rich layer;

oxidizing a predetermined region of each lower aluminum-rich layer and a predetermined region of each upper aluminum-rich layer;

filling the columnar opening hole with an insulating material; and forming an upper electrode on the cap layer and a lower electrode on a back side of the substrate.

12. The method of claim 11 wherein the predetermined region of each lower aluminum-rich layer is underneath the upper electrode, and the predetermined region of each upper aluminum-rich layer is underneath the upper electrode.

13. The method of claim 12 wherein the lower aluminum-rich layer is formed of a material selected from the group consisting of AlGaAs, AlGaInAs, AlP, AlInP, AlGaP, AlInAs and AlGaInP, and the upper aluminum-rich layer is formed of a material selected from the group consisting of AlGaAs, AlGaInAs, AlP, AlInP, AlGaP, AlInAs and AlGaInP.

14. The method of claim 13 wherein the aluminum content of each lower aluminum-rich layer is over 90%, and the aluminum content of each upper aluminum-rich layer is over 90%.

15. The method of claim 11 wherein the active layer is a multiple quantum well structure, the multiple quantum well structure comprises a plurality of quantum well layers and barrier layers alternatively stacking one after the other.

16. A method of manufacturing a light emitting diode based on an epitaxial layer structure, the epitaxial layer structure comprising a substrate of a first conductivity type, a lower cladding layer of the first conductivity type formed on a top side of the substrate, an active layer formed on the lower cladding layer, an upper cladding layer of a second conductivity type formed on the active layer, at least one upper aluminum-rich layer formed on the upper cladding layer, and a cap layer formed on the at least one upper aluminum-rich layer, the method comprising:

forming a columnar trench in the epitaxial layer structure for passing through each upper aluminum-rich layer;

oxidizing a predetermined region of each upper aluminum-rich layer; and forming an upper electrode on the cap layer and a lower electrode on a back side of the substrate.

17. The method of claim 16 wherein the predetermined region of each upper aluminum-rich layer is underneath the upper electrode.

18. The method of claim 17 wherein each upper aluminum-rich layer is formed of a material selected from the group consisting of AlGaAs, AlGaInAs, AlP, AlInP, AlGaP, AlInAs and AlGaInP.

19. The method of claim 18 wherein the aluminum content of each upper aluminum-rich layer is over 90%.

20. The method of claim 16 wherein the active layer is a multiple quantum well structure, the multiple quantum well structure comprises a plurality of quantum well layers and barrier layers alternatively stacking one after the other.

21. A method of manufacturing a light emitting diode based on an epitaxial layer structure, the epitaxial layer structure comprising a substrate of a first conductivity type, at least one lower aluminum-rich layer formed on a top side of the substrate, a lower cladding layer of the first conductivity type formed on the at least one lower aluminum-rich layer, an active layer formed on the lower cladding layer, an upper cladding layer of a second conductivity type formed on the active layer, and a cap layer formed on the upper cladding layer, the method comprising:

forming a columnar trench in the epitaxial layer structure for passing through each lower aluminum-rich layer;

oxidizing a predetermined region of each lower aluminum-rich layer; and forming an upper electrode on the cap layer and a lower electrode on a back side of the substrate.

22. The method of claim 21 wherein the predetermined region of each lower aluminum-rich layer is underneath the upper electrode.

23. The method of claim 22 wherein the lower aluminum-rich layer is formed of a material selected from the group consisting of AlGaAs, AlGaInAs, AlP, AlInP, AlGaP, AlInAs and AlGaInP.

24. The method of claim 23 wherein the aluminum content of each lower aluminum-rich layer is over 90%.

25. The method of claim 21 wherein the active layer is a multiple quantum well structure, the multiple quantum well structure comprises a plurality of quantum well layers and barrier layers alternatively stacking one after the other.

26. A method of manufacturing a light emitting diode based on an epitaxial layer structure, the epitaxial layer structure comprising a substrate of a first conductivity type, at least one lower aluminum-rich layer formed on a top side of the substrate, a lower cladding layer of the first conductivity type formed on the at least one lower aluminum-rich layer, an active layer formed on the lower cladding layer, an upper cladding layer of a second conductivity type formed on the active layer, at least one upper aluminum-rich layer formed on the upper cladding layer, and a cap layer formed on the at least one upper aluminum-rich layer, the method comprising:

forming a columnar trench in the epitaxial layer structure for passing through each lower aluminum-rich layer and each upper lower aluminum-rich layer;

oxidizing a predetermined region of each lower aluminum-rich layer and a predetermined region of each upper aluminum-rich layer; and forming an upper electrode on the cap layer and a lower electrode on a back side of the substrate.

27. The method of claim 26 wherein the predetermined region of each lower aluminum-rich layer is underneath the upper electrode, and the predetermined region of each upper aluminum-rich layer is underneath the upper electrode.

28. The method of claim 27 wherein the lower aluminum-rich layer is formed of a material selected from the group consisting of AlGaAs, AlGaInAs, AlP, AlInP, AlGaP, AlInAs and AlGaInP, and the upper aluminum-rich layer is formed of a material selected from the group consisting of AlGaAs, AlGaInAs, AlP, AlInP, AlGaP, AlInAs and AlGaInP.

29. The method of claim 28 wherein the aluminum content of each lower aluminum-rich layer is over 90%, and the aluminum content of each upper aluminum-rich layer is over 90%.

30. The method of claim 26 wherein the active layer is a multiple quantum well structure, the multiple quantum well structure comprises a plurality of quantum well layers and barrier layers alternatively stacking one after the other.

* * * * *